United States Patent
Bal et al.

(10) Patent No.: US 8,164,367 B1
(45) Date of Patent: Apr. 24, 2012

(54) SPREAD SPECTRUM CLOCK GENERATION TECHNIQUE FOR IMAGING APPLICATIONS

(75) Inventors: Jagdeep Bal, Saratoga, CA (US); Arvind Sridhar, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 533 days.

(21) Appl. No.: 12/354,453

(22) Filed: Jan. 15, 2009

(51) Int. Cl.
*H03L 7/06* (2006.01)

(52) U.S. Cl. ......................................... 327/157; 327/299

(58) Field of Classification Search ........................ None
See application file for complete search history.

(56) References Cited

U.S. PATENT DOCUMENTS

| | | | |
|---|---|---|---|
| 5,610,955 A | 3/1997 | Bland | |
| 6,046,646 A | 4/2000 | Lo et al. | |
| 6,407,642 B2 * | 6/2002 | Dosho et al. | 331/11 |
| 6,665,019 B1 | 12/2003 | Pronkine | |
| 2008/0239147 A1 * | 10/2008 | Kung et al. | 348/516 |

* cited by examiner

*Primary Examiner* — Lincoln Donovan
*Assistant Examiner* — Sibin Chen
(74) *Attorney, Agent, or Firm* — Glass & Associates (57) ABSTRACT

A clock signal generator includes a phase-lock loop for generating an imaging clock signal having a frequency based on a reference clock signal. The imaging clock signal generator also includes a modulation circuit for determining a number of pixels in a horizontal line of an image to be generated based on the imaging clock signal. The modulation circuit generates a modulation signal based on the determined number of pixels and the clock signal generator spreads the frequency of the imaging clock signal across a frequency range based on the modulation signal. In this way, the clock signal generator reduces electromagnetic interference in the imaging clock signal. In further embodiments, the clock signal generator generates an adjustment signal for adjusting the frequency range based on the frequency of the reference clock signal and the frequency of the imaging clock signal.

20 Claims, 8 Drawing Sheets

SPREAD SPECTRUM CLOCK GENERATION TECHNIQUE FOR IMAGING APPLICATIONS

BACKGROUND

Many modern electronic devices operate at clock frequencies high enough to generate substantial electromagnetic interference. Moreover, the electromagnetic interference generated by such an electronic device may adversely affect operation of another electronic device in the same vicinity. In particular, the electromagnetic interference generated by an electronic device may significantly degrade performance of an electrical circuit and adversely impact operation of electronics equipment in the vicinity. Thus, reduction of electromagnetic interference is often a criterion for designing an electronic device. Moreover, an electronic device is typically designed so that electromagnetic interference emitted from the electronic device does not exceed limits regulated by the Federal Communications Commission (FCC).

One technique for reducing electromagnetic interference emitted from electronic devices involves reducing the peak radiated energy of a clock signal by spreading the frequency of the clock signal over a frequency band. As a result, the energy of the clock signal is spread over the frequency band. Spreading the frequency of the clock signal prevents the energy of the clock signal from concentrating at a single frequency and its harmonics which could otherwise cause electromagnetic interference in the clock signal to exceed regulatory limits. Although this technique has been successfully employed to reduce electromagnetic interference in some types of electronic devices, this technique may cause artifacts to occur in a video image displayed by using a video clock signal of the electronic device. In particular, spreading the frequency of the video clock signal may cause unwanted row noise (e.g., extraneous horizontal lines) to occur in the video image.

One spread spectrum technique for reducing electromagnetic interference in a video clock signal of an electronic device involves modulating the video clock signal with a horizontal sync signal of a video display in the electronic device. Modulating the video clock signal with the horizontal sync signal spreads the frequency of the video clock signal and reduces the occurrence of artifacts in a video image displayed by the electronic device. Although this technique has been successfully employed to reduce electromagnetic interference in video clock signals of some types of electronic devices, this technique is sensitive to voltage and temperature variations across an electronic device which reduces the effectiveness of this technique.

In light of the above, a need exists for an improved system and method of reducing electromagnetic interference in a video clock signal of an electronic device. A further need exists for effectively reducing electromagnetic interference in a video clock signal of an electronic device across temperature and voltage variations in the electronic device.

SUMMARY

In various embodiments, an imaging system includes a clock signal generator for generating an imaging clock signal. The imaging system uses the imaging clock signal for synchronizing image data generated by an image source device and displaying an image on a display device of the imaging system based on the image data. The clock signal generator determines a pixel count indicating a number of pixels in a horizontal line of the image to be displayed on the display device. Moreover, the clock signal generator spreads the frequency of the imaging clock signal across a frequency range at a modulation rate determined based on the pixel count. As a result, electromagnetic interference is reduced in the imaging clock signal without causing undesirable artifacts such as row noise (e.g., extraneous horizontal lines) from occurring in the image displayed on the display device.

In further embodiments, the clock signal generator generates the imaging clock signal based on a reference clock signal and modifies the frequency range based on the frequency of the reference clock signal and the frequency of the imaging clock signal. In this way, the clock signal generator finely adjusts the frequency range for conditions, such as voltage and temperature variations, in the clock signal generator. Moreover, adjusting the frequency range for conditions in the clock signal generator improves integrity and reliability of the clock signal generator.

A clock signal generator, in accordance with one embodiment, includes a phase-lock loop and a modulation circuit coupled to the phase-lock loop. The phase-lock loop is configured to generate an imaging clock signal having a frequency based on a reference clock signal. The modulation circuit is configured to determine a pixel count indicating the number of pixels in a horizontal line of an image to be displayed based on the imaging clock signal. The modulation circuit is further configured to generate a modulation signal for spreading the frequency of the imaging clock signal across a frequency range at a modulation rate based on the pixel count.

A clock signal generator, in accordance with one embodiment, includes a phase-lock loop, a modulation circuit, and an adjustment circuit. The modulation circuit is coupled to the phase-lock loop and the adjustment circuit is coupled to the modulation circuit. The phase-lock loop is configured to generate an imaging clock signal having a frequency based on a reference clock signal. The modulation circuit is configured to determine a pixel count indicating the number of pixels in a horizontal line of an image to be displayed based on the imaging clock signal. The modulation circuit is further configured to generate a modulation signal for spreading the frequency of the imaging clock signal across a frequency range at a modulation rate based on the number of pixels in the horizontal line of the image. The adjustment circuit is configured to generate an adjustment signal for modifying the frequency range based on a frequency of the reference clock signal and a frequency of the imaging clock signal.

A method, in accordance with one embodiment, includes determining a pixel count indicating a number of pixels in a horizontal line of an image to be displayed. The method further includes generating an imaging clock signal for displaying the image. Additionally, the method includes spreading a frequency of the imaging clock signal across a frequency range at a modulation rate based on the pixel count to reduce electromagnetic interference in the imaging clock signal. In further embodiments, the method includes generating the imaging clock signal based on a reference clock signal and adjusting the frequency range based on a frequency of the reference clock signal and the frequency of the imaging clock signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a clock signal generator includes a phase-lock loop for generating an imaging clock signal based on a reference clock signal. The clock signal generator also includes a modulation circuit for determining a pixel count indicating the number of pixels in a horizontal line of an image to be generated based on the imaging clock signal. The modulation circuit generates a modulation signal based on the pixel count and the clock signal generator spreads the frequency of the imaging clock signal across a frequency range based on the modulation signal. In this way, the clock signal generator spreads the frequency of the imaging clock signal based on the pixel count, which reduces electromagnetic interference in the imaging clock signal.

In further embodiments, the clock signal generator generates an adjustment signal based on the reference clock signal and the imaging clock signal for adjusting the frequency range. In this way, the clock signal generator compensates for temperature and voltage variations across the clock signal generator.

Figure 1:
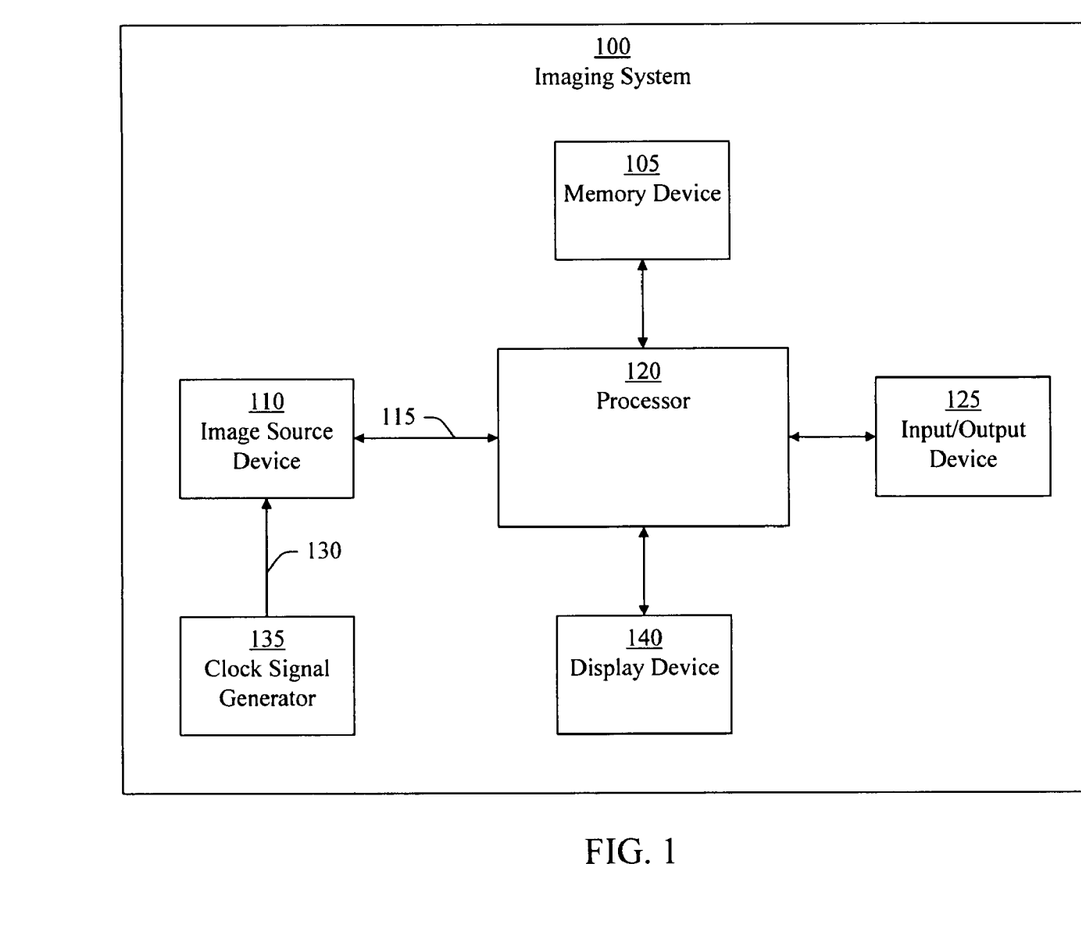
FIG. 1 is a block diagram of an imaging system, in accordance with an embodiment of the present invention.

FIG. 1 illustrates an imaging system 100, in accordance with an embodiment of the present invention. The imaging system 100 includes a memory device 105, an image source device 110, a communication channel 115, a processor 120, an input/output device 125, a clock signal generator 135, and a display device 140. The processor 120 is coupled (e.g., connected) to the memory device 105, the input/output device 125, and the display device 140. Additionally, the processor 120 is coupled to the image source device 110 through the communication channel 115 and the clock signal generator 135 is coupled (e.g., connected) to the image source device 110.

In various embodiments, the imaging system 100 may be any type of system or device for capturing or displaying an image. For example, the imaging system 100 may be a digital camera, a barcode reader, a security camera, a biometric reader, or the like. The image source device 110 may be any device or sensor for generating image data. For example, the image source device 110 may be a charge-coupled device (CCD) or a complementary metal-oxide semiconductor (CMOS) device for converting an optical image into an electrical imaging signal representing the image data. The communication channel 115 may be any device for transmitting the image data from the image source device 110 to the processor 120 and transmitting an imaging clock signal 130 generated by the clock signal generator 135 to the processor 120. For example, the communication channel 115 may be a wired communication link, such as a flex cable.

The processor 120 may be any type of computing system or device, such as a microprocessor, an embedded controller, a microcontroller, an application specific integrated circuit (ASIC), a state machine, or the like. The memory device 105 may be any type of system or device for storing data, such as a random-access-memory (RAM) or a read-only-memory (ROM). The input/output device 125 may be any system or device for providing data (e.g., user input) to the processor 120 or outputting data (e.g., status data) from the processor 120, or both. The display device 140 may be any system or device for displaying an image based on the image data generated by the image source device 110 and the imaging clock signal 130 generated by the clock signal generator 135. For example, the display device 140 may be a video display, such as a liquid crystal display (LCD), for displaying an image based on the image data and the imaging clock signal 130. Moreover, the display device 140 generates pixels of the image based on the imaging clock signal 130.

In various embodiments, the display device 140 generates pixels of the image in horizontal lines based on clock pulses of the imaging clock signal 130. In these embodiments, each horizontal line of the image includes a number of pixels and the display device 140 generates a pixel of the horizontal line based on a corresponding clock pulse of the imaging clock signal 130. For example, a horizontal line of the image may include a series of NC pixels and the display device 140 may generate the series of pixels in the horizontal line based on NC consecutive clock pulses of the imaging clock signal 130.

In some instances, the clock signal generator 135 generates electromagnetic interference in the imaging clock signal 130. In various embodiments, the clock signal generator 135 determines a pixel count indicating the number of pixels in a horizontal line of the image to be displayed by the display device 140. Further, the clock signal generator 135 spreads the frequency of the imaging clock signal 130 across a frequency range at a modulation rate based on the pixel count to reduce electromagnetic interference in the imaging clock signal 130 without causing undesirable artifacts such as row noise (e.g., extraneous horizontal lines) from occurring in the image displayed by the display device 140.

Because the clock signal generator 135 reduces electromagnetic interference in the imaging clock signal 130, the communication channel 115 need not include electromagnetic shielding to reduce electromagnetic interference in the imaging clock signal 130. As a result, the cost of producing the imaging system 100 is reduced. Moreover, the clock signal generator 135 need not use a feedback signal, such as a horizontal sync signal, to generate the imaging clock signal 130. In this way, integrity and reliability of the imaging system 100 is increased.

In various embodiments, the imaging system 100 is implemented in a single semiconductor die. In other embodiments, the imaging system 100 is implemented in more than one semiconductor die. For example, the imaging system 100 may be implemented in multiple semiconductor die packaged in a multichip package.

Figure 2:
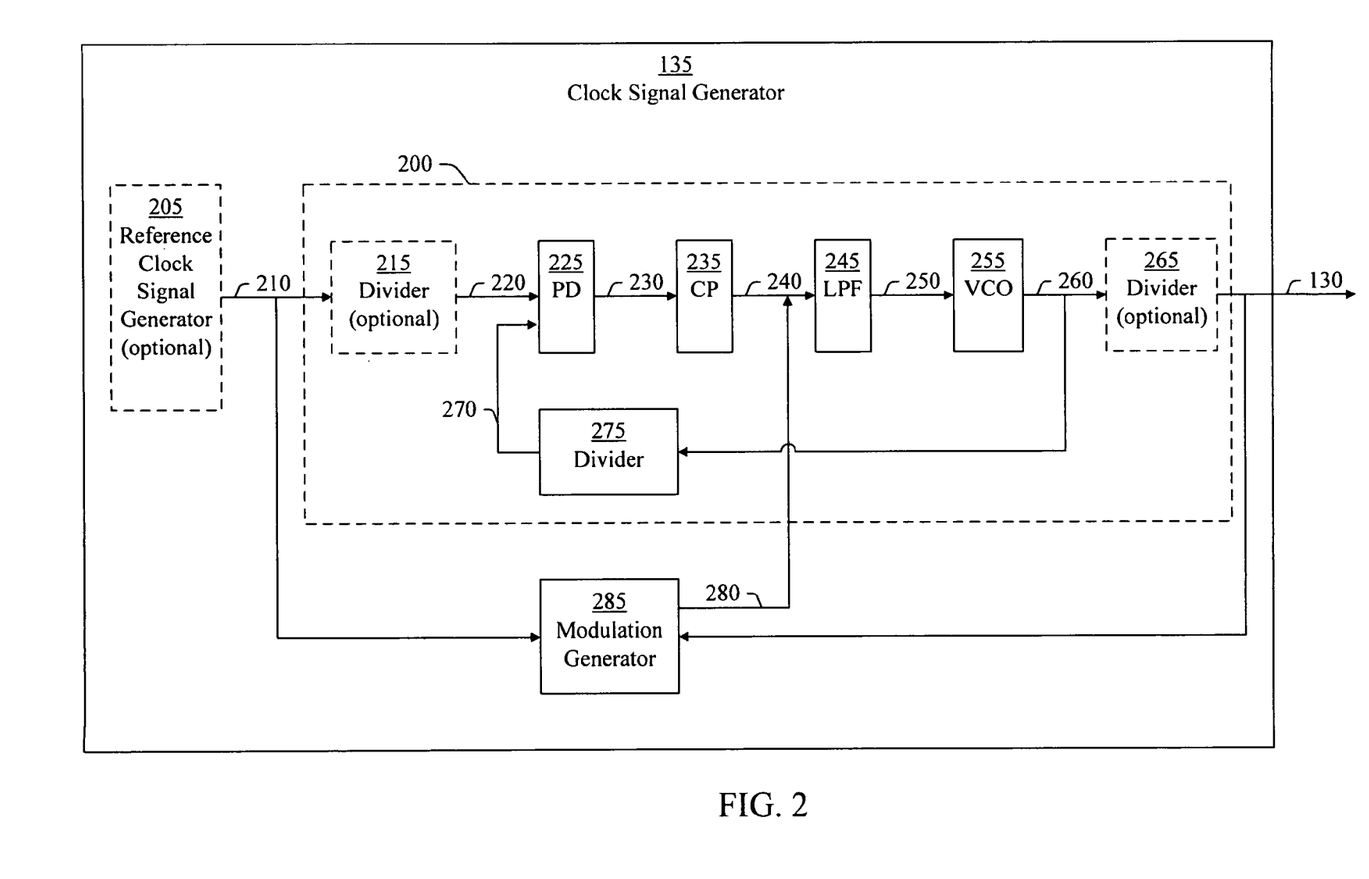
FIG. 2 is a block diagram of clock signal generator, in accordance with an embodiment of the present invention.

FIG. 2 illustrates the clock signal generator 135, in accordance with an embodiment of the present invention. The clock signal generator 135 includes a phase-lock loop 200, an optional reference clock signal generator 205, and a modulation generator 285. The phase-lock loop 200 is coupled (e.g., connected) to the modulation generator 285. The reference clock signal generator 205 generates a reference clock signal 210 and the phase-lock loop 200 generates the imaging clock signal 130 based on the reference clock signal 210. The modulation generator 285 generates a modulation signal 280 for spreading the frequency of the imaging clock signal 130.

In embodiments including the reference clock signal generator 205, the reference clock signal generator 205 is coupled to the phase-lock loop 200 and the modulation generator 285. In embodiments without the reference clock signal generator 205, the clock signal generator 135 receives the reference clock signal 210 from a clock signal source external to the clock signal generator 135.

In one embodiment, the phase-lock loop 200 includes an optional divider 215, a phase detector (PD) 225, a charge pump (CP) 235, a low-pass filter (LPF) 245, a voltage-controlled oscillator (VCO) 255, an optional divider 265, and a divider 275 (e.g., a feedback divider). The phase detector 225 is coupled (e.g., connected) to the divider 215, the charge pump 235, and the divider 275. The low-pass filter 245 is coupled (e.g., connected) to the charge pump 235, the voltage-controlled oscillator 255, and the modulation generator 285. Additionally, the divider 265 is coupled (e.g., connected) to the voltage-controlled oscillator 255 and the modulation generator 285, and the charge pump 235 is coupled (e.g., connected) to the modulation generator 285.

The divider 215 generates a divided reference clock signal 220 based on the reference clock signal 210 by dividing a frequency (e.g., a center frequency) of the reference clock signal 210. In embodiments without the divider 215, the divided reference clock signal 220 and the reference clock signal 210 are the same clock signal. The divider 275 generates a feedback clock signal 270 based on an output clock signal 260 generated by the voltage-controlled oscillator 255 by dividing a frequency (e.g., a center frequency) of the output clock signal 260.

The phase detector 225 generates a phase signal 230 based on the reference clock signal 210 (e.g., the divided reference clock signal 220) and the feedback clock signal 270 indicating a phase difference between the reference clock signal 210 and the feedback clock signal 270. The charge pump 235 generates a charge pump signal 240 based on the phase signal 230. The charge pump signal 240 includes a voltage indicating the phase difference between the reference clock signal 210 and the feedback clock signal 270.

The low-pass filter 245 generates a filtered signal 250 based on the charge pump signal 240 and the modulation signal 280 by combining the charge pump signal 240 with the modulation signal 280 and filtering out higher frequency components of the resultant signal. In this way, the low-pass filter 245 modulates the output clock signal 260 based on the modulation signal 280. In some embodiments, the modulation signal 280 injects a current into the charge pump signal 240 or extracts a current from the charge pump signal 240 to modify the voltage indicated by the charge pump signal 240. The low-pass filter 245 generates the filtered signal 250 by filtering out higher frequency components in the charge pump signal 240.

The voltage-controlled oscillator 255 generates the output clock signal 260 based on the filtered signal 250. In embodiments including the divider 265, the divider 265 generates the imaging clock signal 130 based on the output clock signal 260 by dividing a frequency (e.g., center frequency) of the output clock signal 260. In embodiments without the divider 265, the output clock signal 260 and the imaging clock signal 130 are the same clock signal.

In various embodiments, the clock signal generator 135 is programmable to store a pixel value indicating a pixel count. The pixel count indicates the number of pixels in a horizontal line of an image to be displayed based on the imaging clock signal 130. For example, the clock signal generator 135 may be programmable to store the pixel value based on user input to the clock signal generator 135. In these embodiments, the modulation generator 285 determines the pixel count based on the pixel value stored in the clock signal generator 135. In other embodiments, the clock signal generator 135 is implemented based on a fixed pixel count. For example, the clock signal generator 135 may be implemented to store a fixed pixel value and determine the pixel count based on the fixed pixel value stored in the clock signal generator 135.

In operation, the modulation generator 285 generates the modulation signal 280 based on the pixel count and the phase-lock loop 200 modulates the imaging clock signal 130 based on the modulation signal 280 to spread the frequency of the imaging clock signal 130. In this way, the clock signal generator 135 spreads the frequency of the imaging clock signal 130 at a modulation rate based on the pixel count. As a result, electromagnetic interference in the imaging clock signal 130 is reduced.

In various embodiments, the clock signal generator 135 is implemented in a single semiconductor die. In other embodiments, the clock signal generator 135 is implemented in more than one semiconductor die. For example, the clock signal generator 135 may be implemented in multiple semiconductor die packaged in a multichip package.

Figure 3:
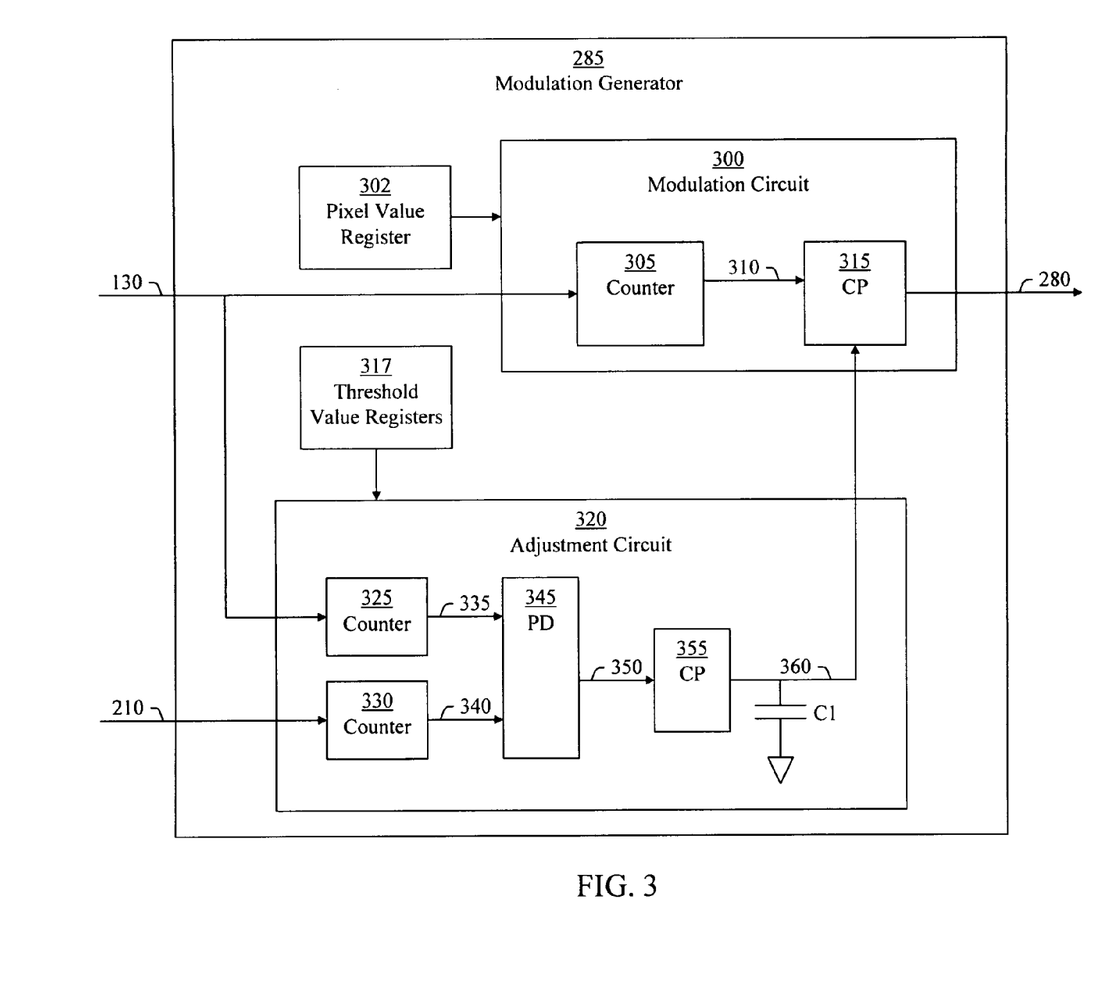
FIG. 3 is a block diagram of a modulation generator, in accordance with an embodiment of the present invention.

FIG. 3 illustrates the modulation generator 285, in accordance with an embodiment of the present invention. The modulation generator 285 includes a modulation circuit 300, a pixel value register 302, threshold value registers 317, and an adjustment circuit 320. The modulation circuit 300 is coupled (e.g., connected) to the pixel value register 302 and the adjustment circuit 320. Additionally, the threshold value registers are coupled (e.g., connected) to the adjustment circuit 320. The modulation circuit 300 includes a counter 305 and a charge pump 315 coupled (e.g., connected) to the counter 305. The counter 305 generates a control signal 310 based on the number of pixels in the horizontal line of the image to be displayed based on the imaging clock signal 130, as is described more fully herein. The control signal 310 indicates whether the charge pump 315 is to increase a charge stored in the charge pump 315 or decrease the charge stored in the charge pump 315. Moreover, the charge pump 315 generates the modulation signal 280 based on the charge stored in the charge pump 315.

In various embodiments, the modulation signal 280 generates a positive current based on the charge stored in the charge pump 315 when the control signal 310 indicates the charge pump 315 is to increase the charge stored in the charge pump 315. In this way, the modulation signal 280 injects a current into the charge pump signal 240. Further, the modulation signal 280 generates a negative current based on the charge stored in the charge pump 315 when the control signal 310 indicates the charge pump 315 is to decrease the charge stored in the charge pump 315. In this way, the modulation signal 280 extracts a current from the charge pump signal 240.

The pixel value register 302 stores a pixel value indicating a pixel count. The pixel count is the number of pixels in a horizontal line of the image to be displayed based on the imaging clock signal 130. The counter 305 determines the pixel count based on the pixel value, generates the control signal 310 based on the pixel count, and maintains a count from one to the pixel count based on the imaging clock signal 130. Moreover, the counter 305 generates the control signal 310 indicating the charge pump 315 is to increase the charge stored in the charge pump 315 when the count maintained by the counter 305 is in a first range from one to one-half of the pixel count. Further, the counter 305 generates the control signal 310 indicating the charge pump 315 is to decrease the charge stored in the charge pump 315 when the count maintained by the counter 305 is in a second range from one greater than one-half the pixel count to the pixel count. For example, the pixel count may be an even integer value NC and one-half of the pixel count may be an integer value NC/2. In this example, the first range includes integers from 1 to NC/2 and the second range includes integers from NC/2+1 to NC. In some embodiments, the pixel value register 302 is optional. In these embodiments, the modulation generator 285 stores the pixel value in another component of the modulation generator 285. For example, the modulation generator 285 may store the pixel value in the counter 305. In some embodiments, the counter 305 contains the pixel value register 302.

The adjustment circuit 320 includes a counter 325, a counter 330, a phase detector 345, a charge pump 355, and a capacitor C1. The counter 325 is coupled (e.g., connected) to the divider 265 and receives the imaging clock signal 130 from the divider 265. The counter 330 is coupled to the reference clock signal generator 205 and receives the reference clock signal 210 from the reference clock signal generator 205. The phase detector 345 is coupled (e.g., connected) to the counter 325, the counter 330, and the charge pump 355. One end of the capacitor C1 is coupled (e.g., connected) to the charge pump 355 and the charge pump 315, and the other end of the capacitor C1 is connected to a ground potential. In embodiments without the divider 265, the counter 325 is coupled (e.g., connected) to the voltage-controlled oscillator 255 and receives the imaging clock signal 130 (e.g., the output clock signal 260) from the voltage-controlled oscillator 255. In embodiments without the reference clock signal generator 205, the counter 330 receives the reference clock signal 210 from a clock signal source external to the clock signal generator 135.

The threshold value registers 317 store a threshold value for the counter 325 and a threshold value for the counter 330. The counter 325 maintains a count of clock cycles in the imaging clock signal 130 and generates a control signal 335 based on the count. In operation, the counter 325 is initialized to a count of zero. For example, the clock signal generator 135 may initialize the counter 325 to zero upon power up or reset of the clock signal generator 135. Further, the counter 325 generates the control signal 335 indicating when the count of the counter 325 has reached the threshold value (e.g., a predetermined threshold value) of the counter 325. The counter 325 then resets the count and repeats this operation.

The counter 330 maintains a count of clock cycles in the reference clock signal 210 and generates a control signal 340 based on the count. In operation, the counter 330 is initialized to a count of zero. For example, the clock signal generator 135 may initialize the counter 330 to zero upon power up or reset of the clock signal generator 135. Further, the counter 330 generates the control signal 340 indicating when the count of the counter 330 has reached the threshold value (e.g., a predetermined threshold value) of the counter 330. The counter 330 then resets the count and repeats this operation.

In one embodiment, the counter 325 generates the control signal 335 so that the control signal 335 has a pulse (e.g., a voltage pulse) when the count of the counter 325 reaches the threshold value of the counter 325. Further, the counter 330 generates the control signal 340 so that the control signal 340 has a pulse (e.g., a voltage pulse) when the count of the counter 330 reaches the threshold value of the counter 330. The phase difference between the pulses of the control signals 335 and 340 indicates whether the phase-lock loop 200 is undermodulating or overmodulating the imaging clock signal 130. In some embodiments, the threshold value register 317 is optional. In these embodiments, the modulation generator 285 stores the threshold value in another component of the modulation generator 285. For example, the modulation generator 285 may store the threshold value in each of the counters 325 and 330.

The phase detector 345 generates a phase signal 350 indicating a phase difference between the control signal 335 and the control signal 340. In turn, the charge pump 355 generates the adjustment signal 360 based on the phase signal 350. In this embodiment, the adjustment signal 360 includes a current indicating the phase difference between the control signal 335 and the control signal 340. Moreover, the capacitor C1 charges up to a voltage based on the current in the adjustment signal 360, which indicates whether the phase-lock loop 200 is undermodulating or overmodulating the imaging clock signal 130.

The charge pump 315 adjusts the modulation signal 280 based on the adjustment signal 360. For example, the charge pump 315 may include a voltage-controlled current source that adjusts the current of the modulation signal 280 based on the voltage of the adjustment signal 360. In this way, the charge pump 315 finely adjusts the current of the modulation signal 280 based on the adjustment signal 360. Moreover, the adjustment circuit 320 generates the adjustment signal 360 to compensate for voltage and temperature variations across the clock signal generator 135. In turn, the modulation circuit 300 adjusts the current of the modulation signal 280 based on the adjustment signal 360 to compensate for voltage and temperature variations across the clock signal generator 135. In this way, integrity and reliability of the clock signal generator 135 is increased.

In one embodiment, the capacitor C1 has a capacitance of fifty picofarads (50 pF) and the current of the adjustment signal 360 is in a range from negative one hundred microamps (−100 uA) to one hundred microamps (100 uA). Further, the current of the modulation signal 280 is in a range from negative one hundred nanoamps (−100 nA) to one hundred nanoamps (100 nA).

In one embodiment, the frequency of the reference clock signal 210 is twenty-four megahertz (24 MHz) and the frequency of the imaging clock signal 130 is forty-eight megahertz (48 MHz). Thus, the ratio of the frequency of the imaging clock signal 130 to the frequency of the reference clock signal 210 is two. Moreover, the threshold values of the counters 325 and 330 are selected such that the ratio of the threshold value of the counter 325 to the threshold value of the counter 330 is two. For example, the threshold value of the counter 325 may be one-thousand and the threshold value of the counter 330 may be five-hundred. In some embodiments, the threshold values of the counters 325 and 330 may be fixed during implementation of the clock signal generator 135. In other embodiments, the threshold values of the counters 325 and 330 are programmable, for example based on user input to the clock signal generator 135.

In various embodiments, the threshold values of the counters 325 and 330 are selected based on a divisor M of the divider 215, a divisor B of the divider 265, and a divisor N of the divider 275. In these embodiments, the frequency of the output clock signal 260 is N/M times the frequency of the reference clock signal 210 and the frequency of the imaging clock signal 130 is N/(M×B) times the frequency of reference clock signal 210. Moreover, the ratio of the threshold value of the counter 325 to the threshold value of the counter 330 is N/(M×B). For example, the divisor N may be four and each of the divisors M and B may be two. In this example, the ratio of the threshold value of the counter 325 to the threshold value of the counter 330 is one (e.g., 4/(2×2)). In some embodiments, the threshold values of the counters 325 and 330, and the divisors of the dividers 215, 265, and 275, may be fixed during implementation of the clock signal generator 135. In other embodiments, the threshold values of the counters 325 and 330, and the divisors of the dividers 215, 265, and 275, are programmable, for example based on user input to the clock signal generator 135.

In various embodiments, the current in the charge pump signal 240 and the current in the modulation signal 280 generate a voltage in the low-pass filter 245. The voltage generated by the charge pump signal 240 determines a center frequency of the imaging clock signal 130 and the voltage generated by the modulation signal 280 determines a frequency range of the imaging clock signal 130 about the center frequency of the imaging clock signal 130. Moreover, the voltage generated by the modulation signal 280 has an amplitude that varies between a lower voltage and a higher voltage and the imaging clock signal 130 has a frequency range that varies between a lower frequency and a higher frequency of a frequency range based on the amplitude of the modulation signal 280. In various embodiments, the modulation generator 285 is programmable to select a peak amplitude of voltage generated by the modulation signal 280. In this way, the frequency range of the imaging clock signal 130 is programmable based on the selected peak amplitude of the modulation signal 280.

In one embodiment, the frequency range of the imaging clock signal 130 is selected based on user input such that the frequency of the imaging clock signal 130 is spread by one percent (1%), two percent (2%), three percent (3%), or four percent (4%). For example, the frequency range of the imaging clock signal 130 may be selected based on user input such that the imaging clock signal 130 has a frequency that varies by plus or minus one percent (+/−1%) of the center frequency of the imaging clock signal 130. In this way, the frequency of the imaging clock signal 130 is spread by two percent (2%).

Figure 4:
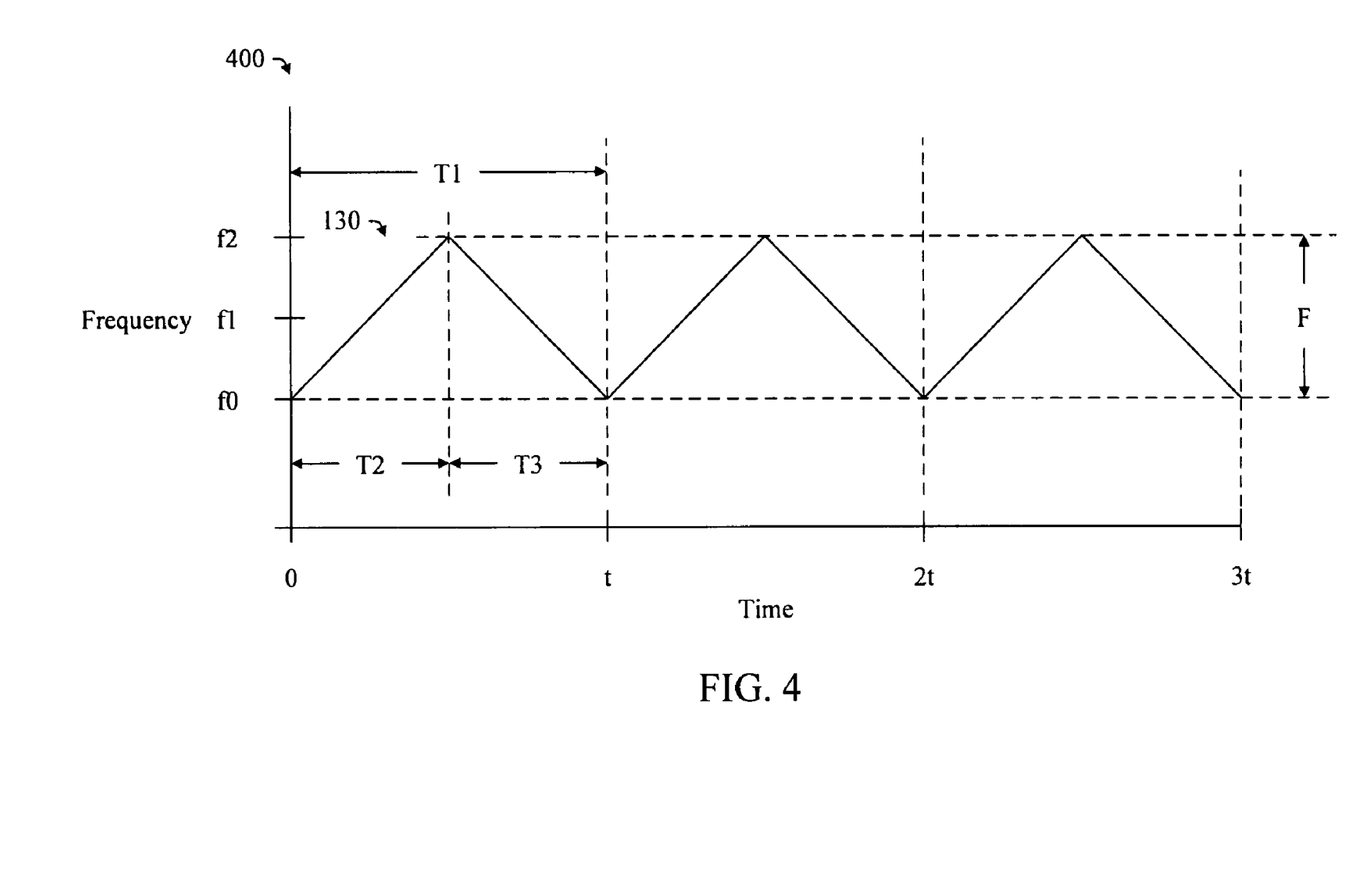
FIG. 4 is a frequency profile of an imaging clock signal, in accordance with an embodiment of the present invention.

FIG. 4 illustrates a frequency profile 400 of the imaging clock signal 130, in accordance with an embodiment of the present invention. The frequency profile 400 indicates the frequency of the imaging clock signal 130 over time. The imaging clock signal 130 has a center frequency f1 and includes cycles in which the imaging clock signal 130 varies over a frequency range. As illustrated in FIG. 4, the imaging clock signal 130 includes a cycle T1 in which the frequency of the imaging clock signal 130 various over a frequency range F. As also illustrated in FIG. 4, the frequency range F includes the center frequency f1 of the imaging clock signal 130 and spans from a lower frequency f0 to a higher frequency f2 based on the peak amplitude of the modulation signal 280.

The cycle T1 of the imaging clock signal 130 has a time period t and includes a first half-cycle T2 followed by a second half-cycle T3. Each of the half-cycles T2 and T3 has a time period of t/2. In the first half-cycle T2, the amplitude of the modulation signal 280 increases linearly and the frequency of the imaging clock signal 130 increases linearly from the lower frequency f0 to the higher frequency f2. In the second half-cycle T3, the amplitude of the modulation signal 280 decreases linearly and the frequency of the imaging clock signal 130 decreases linearly from the frequency f2 to the frequency f0. Moreover, the imaging clock signal 130 is substantially triangular-shaped and oscillates about the center frequency f1.

Figure 5:
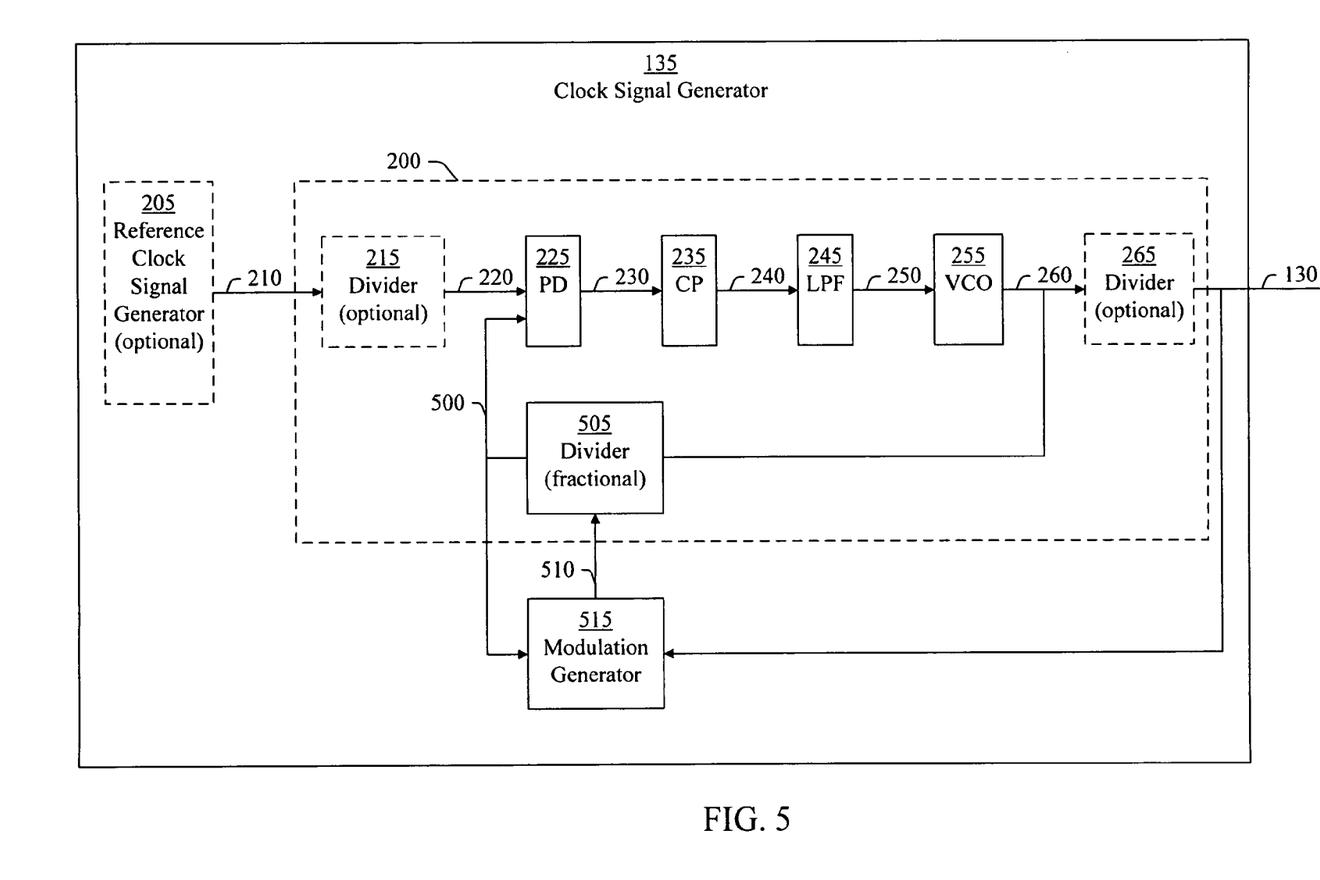
FIG. 5 is a block diagram of clock signal generator, in accordance with an embodiment of the present invention.

FIG. 5 illustrates the clock signal generator 135, in accordance with an embodiment of the present invention. The clock signal generator 135 of FIG. 5 is similar to the clock signal generator 135 of FIG. 2 and includes the optional reference clock signal generator 205, the optional divider 215, the phase detector 225, the charge pump 235, the low-pass filter 245, the voltage-controlled oscillator 255, and the optional divider 265. In contrast to the clock signal generator 135 of FIG. 2, the clock signal generator 135 of FIG. 5 includes a divider 505 instead of the divider 275 and includes a modulation generator 515 instead of the modulation generator 285. The divider 505 is a fractional divider and is coupled to the phase detector 225, the voltage-controlled oscillator 255, and the modulation generator 515.

The modulation generator 515 receives the feedback clock signal 500 from the divider 505. Additionally, the modulation generator 515 is coupled (e.g., connected) to the voltage-controlled oscillator 255 through the divider 265 and receives the imaging clock signal 130 from the divider 265. In embodiments without the divider 265, the modulation generator 515 receives the imaging clock signal 130 (e.g., the output clock signal 260) from the voltage-controlled oscillator 255.

The modulation generator 515 determines a pixel count indicating the number of pixels in a horizontal line of an image, which is to be displayed based on the imaging clock signal 130, and generates a modulation signal 510 for spreading the frequency of the imaging clock signal 130 at a modulation rate based on the pixel count. In further embodiments, the modulation generator 515 adjusts the modulation signal 510 based on the feedback clock signal 500 and the frequency of the imaging clock signal 130, as is described more fully herein.

The divider 505 generates a feedback clock signal 500 based on the output clock signal 260 and the modulation signal 510 and provides the feedback clock signal 500 to the phase detector 225. In turn, the phase detector 225 generates the phase signal 230 based on the reference clock signal 210 (e.g., the divided reference clock signal 220) and the feedback clock signal 500 indicating a phase difference between the reference clock signal 210 and the feedback clock signal 500.

In the clock signal generator 135 of FIG. 5, the modulation signal 510 is a control signal for controlling operation of the divider 505. In response to the modulation signal 510, the divider 505 generates the feedback clock signal 500 by dividing the frequency of the output clock signal 260 by a divisor of the divider 505 and an adjustment value indicated by the modulation signal 510. Moreover, the adjustment value indicated by the modulation signal 510 may indicate a fractional value for the divisor and the divider 505 may divide the frequency of the output clock signal 260 by the fractional value.

In various embodiments, the modulation generator 515 determines a pixel count indicating a number of pixels in a horizontal line of an image to be displayed based on a pixel value and generates the modulation signal 510 based on the pixel count, the imaging clock signal 130, and the feedback clock signal 500. The divider 505 generates the feedback clock signal 500 based on the imaging clock signal 130 and modifies the frequency of the feedback clock signal 500 in discrete steps based on the modulation signal 510. In turn, the phase-lock loop 200 modulates the imaging clock signal 130 based on the feedback clock signal 500 to spread the frequency of the imaging clock signal 130. In this way, the clock signal generator 135 spreads the frequency of the imaging clock signal 130 at a modulation rate based on the pixel count. As a result, electromagnetic interference in the imaging clock signal 130 is reduced.

Figure 6:
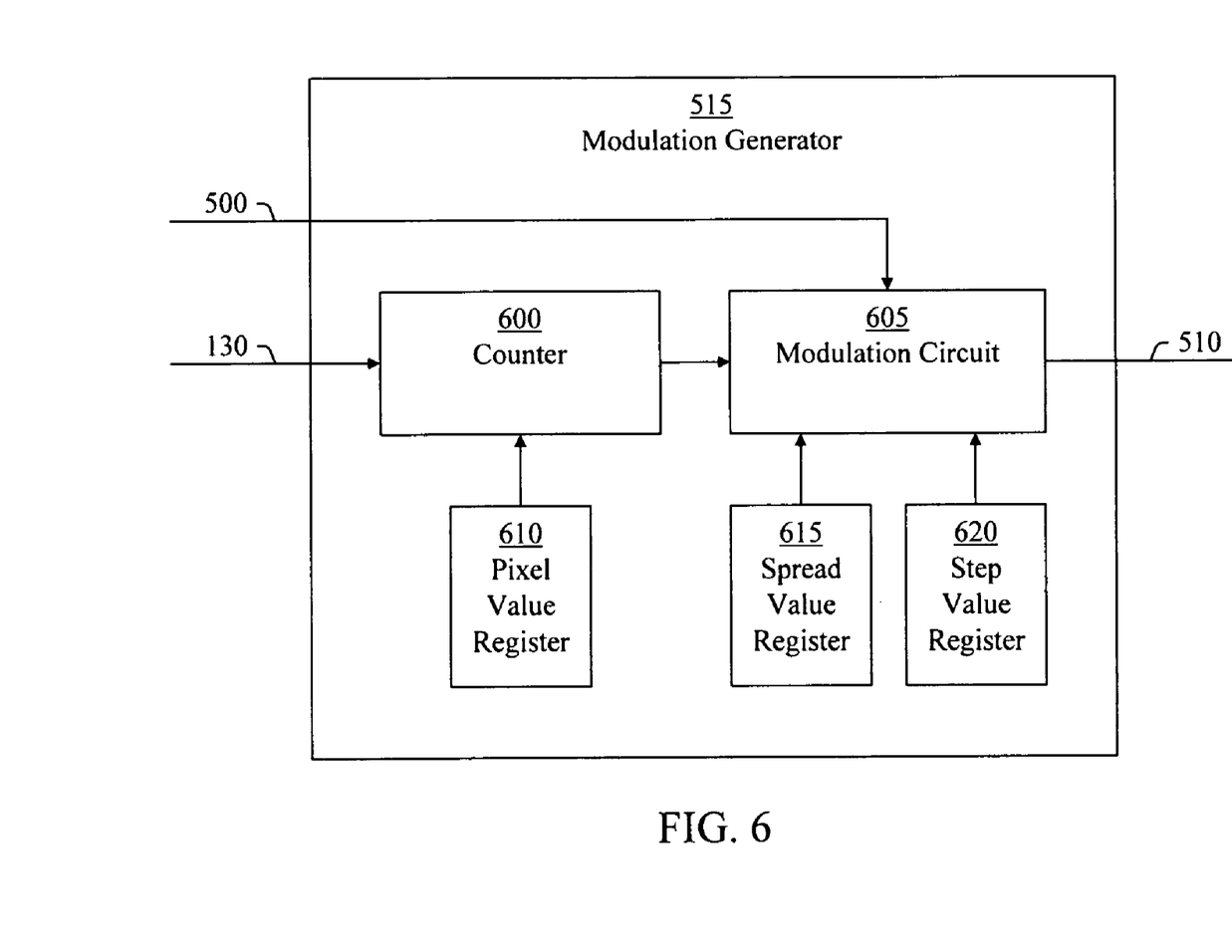
FIG. 6 is a block diagram of a modulation generator, in accordance with an embodiment of the present invention.

FIG. 6 illustrates the modulation generator 515, in accordance with an embodiment of the present invention. The modulation generator 515 includes a counter 600, a modulation circuit 605, a pixel value register 610, a spread value register 615, and a step value register 620. The counter 600 is coupled (e.g., connected) to the pixel value register 610 and the modulation circuit 605. Additionally, the modulation circuit 605 is coupled (e.g., connected) to the spread value register 615 and the step value register 620. The pixel value register 610 stores a pixel value indicating a pixel count. The pixel count is the number of pixels in a horizontal line of the image to be displayed based on the imaging clock signal 130. The spread value register 615 stores a spread value indicating the frequency spread of the imaging clock signal 130. For example, the spread value may indicate a percentage over which the frequency of the imaging clock signal 130 is to be spread. The step value register 620 stores a step value indicating a number of discrete frequencies in a frequency range over which the frequency of the imaging clock signal 130 is spread.

In some embodiments, the pixel value register 610, the spread value register 615, and the step value register 620 are optional. In these embodiments, the modulation generator 515 stores the pixel value, the spread value, and the step value in another component of the modulation generator 515. For example, the modulation generator 515 may store the pixel value in the counter 600 and store the step value and the spread value in the modulation circuit 605. In some embodiments, the counter 600 contains the pixel value register 610 and the modulation circuit 605 contains the spread value register 615 and the step value register 620. In some embodiments, the modulation circuit 605 is a delta-sigma modulator. In other embodiments, the modulation circuit 605 includes a delta-sigma modulator along with control circuitry for controlling operation of the delta-sigma modulator.

In various embodiments, the counter 600 maintains a count based on the pixel value stored in the pixel value register 610 and imaging clock signal 130. For example, the counter 600 may be an up/down counter including control circuitry for counting up from one to one-half of the pixel value based on the imaging clock signal 130 and then counting back down to zero. The modulation circuit 605 generates the modulation signal 510 indicating an adjustment value for adjusting the divisor of the divider 505 based on the spread value and the step value. Moreover, the modulation circuit 605 determines an initial adjustment value when the count maintained by the counter 600 indicates that the counter 600 has reached the pixel value. In this way, the modulation circuit 605 determines the modulation rate for modulating the imaging clock signal 130 based on the pixel count. Further, the modulation circuit 605 updates (e.g., modifies) the modulation signal 510 based on a clock cycle boundary of the feedback clock signal 500. In this way, the modulation circuit 605 synchronizes the modulation signal 510 with the feedback clock signal 500. In turn, the divider 505 generates the feedback clock signal 500 by dividing the frequency of the output clock signal 260 based on the divisor of the divider 505 and the adjustment value indicated by the modulation signal 510.

In various embodiments, the modulation circuit 605 determines when the count maintained by the counter 600 is in a first range from one to one-half of the pixel count and increases the divisor of the divider 505 in discrete steps in the first range. For example, the modulation circuit 605 may determine whether the count of the counter 600 is in a first range based on the count of the counter 600 and the pixel value stored in the pixel value register 610. As a result, the divider 505 decreases the frequency of the feedback clock signal 500 in discrete steps in the first range, which causes the frequency of the output clock signal 260 to increase in discrete steps in the first range.

Further, the modulation circuit 605 determines when the count maintained by the counter 600 is in a second range from one greater than one-half the pixel count to the pixel count and decreases the divisor of the divider 505 in discrete steps in the second range. For example, the modulation circuit 605 may determine whether the count of the counter 600 is in a second range based on the count of the counter 600 and the pixel value stored in the pixel value register 610. As a result, the divider 505 increases the frequency of the feedback clock signal 500 in discrete steps in the second range, which causes the frequency of the output clock signal 260 to decrease in discrete steps in the second range.

For example, the pixel count may be an even integer value NC and one-half of the pixel count may be an integer value NC/2. In this example, the first range includes integers from 1 to NC/2 and the second range includes integers from NC/2+1 to NC. Further in this example, the spread value may indicate a frequency spread of two percent (2%) indicating the frequency (e.g., the center frequency) of the imaging clock signal 130 is to be spread over a range from one percent less than the frequency of the imaging clock signal 130 to one percent greater than the frequency of the imaging clock signal 130 (e.g., +/−1%). Additionally, the step value indicates the frequency profile of the imaging clock signal 130 is to have four steps (e.g., five discrete frequencies).

In this example, the modulation circuit 605 generates the modulation signal 510 to indicate a first series of adjustment values in the first range and a second series of adjustment values in the second range. The first series of adjustments values indicate that the divider 505 is to increase the divisor of the divider 505 in a series of four discrete steps. For example, the divider 505 may have a divisor N set to a value of 10.0 and the first series of adjustment values may indicate that the divider 505 is to set the divisor N to the series of values 9.9, 9.95, 10.0, 10.05, and 10.1 for adjusting the frequency of the imaging clock signal successively by −1.0%, −0.5%, 0.0%, 0.5%, and 1.0%. The second series of adjustments values indicate that the divider 505 is to decrease the divisor of the divider 505 in a series of four discrete steps. For example, the second series of adjustment values may indicate that the divider 505 is to set the divisor N to the series of values 10.1, 10.05, 10.0, 9.95, and 9.9 for adjusting the frequency of the imaging clock signal successively by 1.0%, 0.5%, 0.0%, −0.5%, and −1.0%. In this way, the frequency of the imaging clock signal 130 is modulated at a modulation rate based on the pixel count.

In various embodiments, the modulation circuit 605 generates the modulation signal 510 so that the divider 505 divides the frequency of the output clock signal 260 in a number of steps (e.g., predetermined steps) over a frequency range (e.g., predetermined frequency range) about a center frequency of the imaging clock signal 130. Moreover, the frequency range and the number of steps are selected by the clock signal generator 135, for example based on user input (e.g., the pixel value, the spread value, and the step value) to the clock signal generator 135. In this way, the clock signal generator 135 spreads the frequency of the imaging clock signal 130 over a frequency range in the number of steps.

In one embodiment, the frequency range of the imaging clock signal 130 is selected based on user input such that the frequency of the imaging clock signal 130 is spread by one percent (1%), two percent (2%), three percent (3%), or four percent (4%). For example, the clock signal generator 135 may select the frequency range of the imaging clock signal 130 based on user input such that the imaging clock signal 130 has a frequency that varies by plus or minus one percent (+/−1%) of the center frequency of the imaging clock signal 130. In this way, the frequency of the imaging clock signal 130 is spread by two percent (2%). Moreover, the clock signal generator 135 may select the number of steps in the frequency range of the imaging clock signal 130.

For example, the clock signal generator 135 may generate the imaging clock signal 130 having a center frequency of forty-eight megahertz (48 MHz) and select a frequency range such that frequency of the imaging clock signal is spread by one-percent (1%). Further, the clock signal generator 135 may select the number of steps (e.g., discrete steps) in the frequency range to be four. In this example, the frequency range is from forty-seven thousand seven hundred sixty kilohertz (47.760 MHz) to forty-eight thousand two hundred forty kilohertz (48.240 MHz), and each step is one hundred twenty kilohertz (120 KHz). Thus, the divider 505 generates the frequency of the feedback clock signal 500 so that the phase-lock loop 200 generates the imaging clock signal 130 to have discrete frequencies of forty-seven thousand seven hundred sixty kilohertz (47.760 MHz), forty-seven thousand eight hundred eighty kilohertz (47.880 MHz), forty-eight megahertz (48 MHz), forty-eight thousand one hundred twenty kilohertz (48.120 MHz), and forty-eight thousand two hundred forty kilohertz (48.240 MHz).

Figure 7:
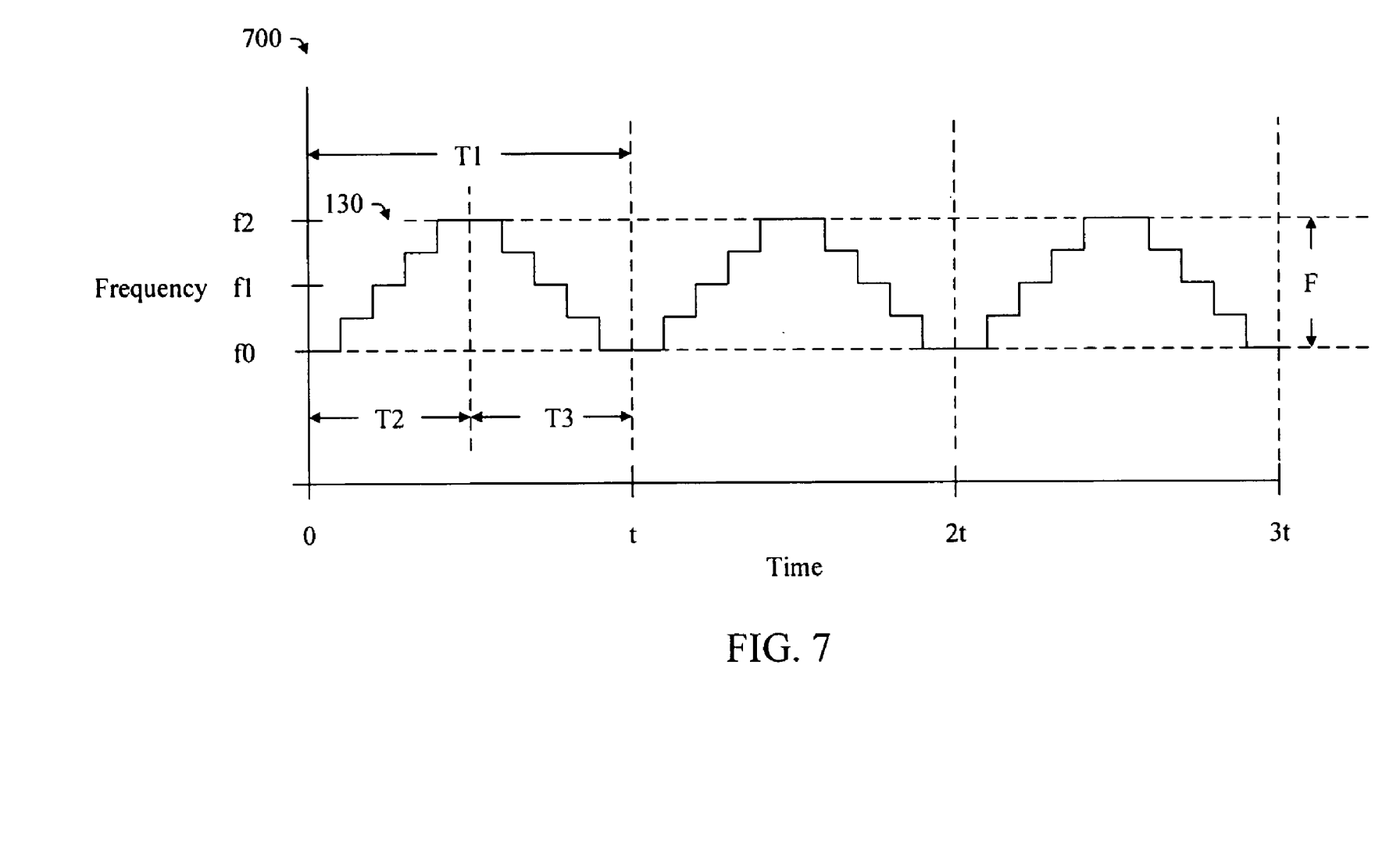
FIG. 7 is a frequency profile of an imaging signal, in accordance with an embodiment of the present invention.

FIG. 7 illustrates a frequency profile 700 of the imaging clock signal 130, in accordance with an embodiment of the present invention. The frequency profile 700 indicates the frequency of the imaging clock signal 130 over time. The imaging clock signal 130 has a center frequency f1 and includes cycles in which the imaging clock signal 130 varies over a frequency range. As illustrated in FIG. 7, the imaging clock signal 130 includes a cycle T1 in which the frequency of the imaging clock signal 130 various over a frequency range F. As also illustrated in FIG. 7, the frequency range F includes the center frequency f1 of the imaging clock signal 130 and spans from a lower frequency f0 to a higher frequency f2 based on the peak amplitude of the modulation signal 510.

The cycle T1 of the imaging clock signal 130 has a time period t and includes a first half-cycle T2 followed by a second half-cycle T3. Each of the half-cycles T2 and T3 has a time period of t/2. In the first half-cycle T2, the frequency of the imaging clock signal 130 increases step-wise (e.g., in discrete steps) from the lower frequency f0 to the higher frequency f2. In the second half-cycle T3, the frequency of the imaging clock signal 130 decreases step-wise (e.g., in discrete steps) from the frequency f2 to the frequency f0. In this way, the frequency of the imaging clock signal 130 has a step-up waveform in the first half-cycle T2 and a step-down waveform in the second half-cycle T3. Moreover, the imaging clock signal 130 is substantially triangular-shaped and oscillates about the center frequency f1.

Figure 8:
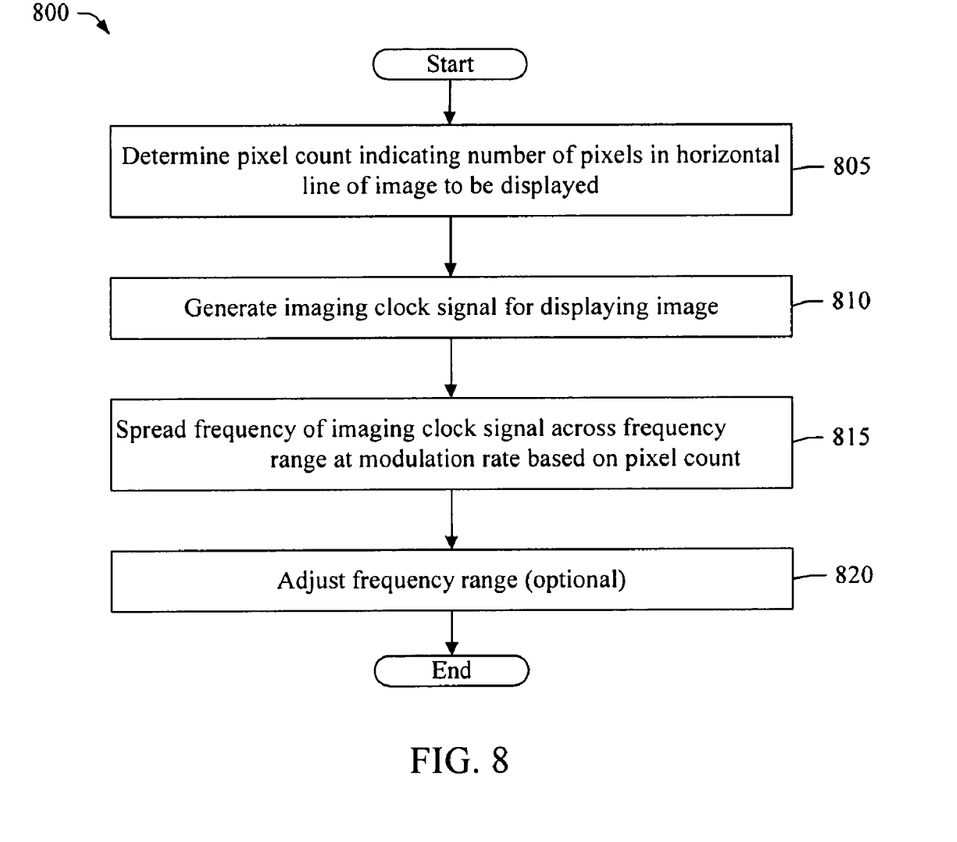
FIG. 8 is a flow chart of a method of spreading a frequency of an imaging clock signal, in accordance with an embodiment of the present invention.

FIG. 8 illustrates a method 800 of spreading a frequency of an imaging clock signal, in accordance with an embodiment of the present invention. In step 805, a pixel count is determined for indicating the number of pixels in a horizontal line of an image to be displayed based on an imaging clock signal. In various embodiments, the clock signal generator 135 determines the pixel count based on a pixel value stored in the clock signal generator 135. For example, the pixel value may be stored in a memory device, such as a random-access memory (RAM), a read-only memory (ROM), a register, to the like, in the clock signal generator 135. In some embodiments, the clock signal generator 135 is programmable to select the pixel count, for example based on user input indicating the pixel value. The method 800 then proceeds to step 810.

In step 810, the imaging clock signal is generated for displaying the image. In various embodiments, the clock signal generator 135 generates the imaging clock signal 130 for the image to be displayed. For example, the clock signal generator 135 may generate the clock imaging signal 130 to display an image on the display device 140 of the imaging system 100. The method 800 then proceeds to step 815.

In step 815, the frequency of the imaging clock signal is spread across a frequency range at a modulation rate based on the pixel count. In various embodiments, the phase-lock loop 200 of the clock signal generator 135 spreads the frequency of the imaging clock signal 130 across a frequency range at a modulation rate based on the pixel count. In one embodiment, the phase-lock loop 200 spreads the frequency of the imaging clock signal 130 across a frequency range at a modulation rate based on the modulation signal 280 generated by the modulation generator 285. Further in this embodiment, the modulation signal 280 determines the frequency range for modulating the imaging clock signal 130 about a center frequency of the imaging clock signal 130. In this way, the modulation signal 280 determines the amount of modulation of the imaging clock signal 130. In another embodiment, the phase-lock loop 200 spreads the frequency of the imaging clock signal 130 across a frequency range at a modulation rate based on the modulation signal 510 generated by the modulation generator 515. Moreover, the modulation signal 510 determines the frequency range for modulating the imaging clock signal 130 about a center frequency of the imaging clock signal 130. In this way, the modulation signal 510 determines the amount of modulation of the imaging clock signal 130. The method 800 then proceeds to step 820.

In optional step 820, the frequency range of the imaging clock signal is adjusted. In various embodiments, the clock signal generator 135 generates an adjustment signal based on the frequency of the reference clock signal 210 and the frequency of the imaging clock signal 130. In one embodiment, the adjustment circuit 320 of the modulation circuit 300 generates the adjustment signal 360 based on the frequency of the reference clock signal 210 and the frequency of the imaging clock signal 130 and the modulation circuit adjusts the modulation signal 280 based on the adjustment signal 360. In this way, the clock signal generator 135 compensates for temperature and voltage variations across the clock signal generator 135. The method 800 then ends.

In various embodiments, the method 800 may include more or fewer steps than the steps 805-820 described above and illustrated in FIG. 8. In some embodiments, one or more of the steps 805-820 of the method 800 may be performed in parallel or substantially simultaneously. For example the step 815 and the step 820 may be performed in parallel. In various embodiments, the steps 805-820 of the method 800 may be performed in a different order than the order described above and illustrated in FIG. 8. For example, step 810 may be performed before step 805.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A clock signal generator, comprising:
a phase-lock loop configured to generate an imaging clock signal having a frequency based on a reference clock signal; and
a modulation circuit coupled to the phase-lock loop and configured to determine a pixel count indicating the number of pixels in a horizontal line of an image to be displayed based on the imaging clock signal and generate a modulation signal for spreading the frequency of the imaging clock signal across a frequency range at a modulation rate based on the pixel count, wherein the modulation signal comprises a first half-cycle and a second half-cycle following the first half cycle, and wherein the phase-lock loop comprises a low-pass filter coupled to the modulation circuit and configured to increase the frequency of the imaging clock signal in the first half-cycle based on the modulation signal and decrease the frequency of the imaging clock signal in the second half-cycle based on the modulation signal.

2. The clock signal generator of claim 1, wherein the modulation circuit is further configured to increase a current of the modulation signal in the first half-cycle of the modulation signal for increasing the frequency of the imaging clock signal and decrease the current of the modulation signal in the second half-cycle of the modulation signal for decreasing the frequency of the imaging clock signal.

3. The clock signal generator of claim 2, wherein the modulation signal has a triangular-shaped waveform.

4. The clock signal generator of claim 1, further comprising an adjustment circuit coupled to the modulation circuit configured to generate an adjustment signal for modifying the frequency range based on a frequency of the reference clock signal and a frequency of the imaging clock signal.

5. The clock signal generator of claim 1, wherein the clock signal generator is programmable to store a pixel value indicating the number of pixels in the horizontal line of the image and the modulation circuit is further configured to determine the pixel count based on the pixel value.

6. The clock signal generator of claim 1, wherein the modulation circuit is further configured to generate the modulation signal for reducing electromagnetic interference in the imaging clock signal.

7. A clock signal generator, comprising:
a phase-lock loop configured to generate an imaging clock signal having a frequency based on a reference clock signal; and
a modulation circuit coupled to the phase-lock loop and configured to determine a pixel count indicating the number of pixels in a horizontal line of an image to be displayed based on the imaging clock signal and generate a modulation signal for spreading the frequency of the imaging clock signal across a frequency range at a modulation rate based on the pixel count, wherein the modulation signal comprises a first half-cycle and a second half-cycle following the first half cycle, and wherein the phase-lock loop is further configured to increase the frequency of the imaging clock signal in the first half-cycle based on the modulation signal and decrease the frequency of the imaging clock signal in the second half-cycle based on the modulation signal.

8. The clock signal generator of claim 7, wherein the phase-lock loop comprises:
a divider configured to generate a feedback clock signal by dividing the frequency of the imaging clock signal;
a phase detector coupled to the divider and configured to generate a phase signal indicating a phase difference between the reference clock signal and the feedback clock signal;
a charge pump coupled to the phase detector and configured to generate a charge pump signal based on the phase signal;
a low-pass filter coupled to the charge pump and the modulation circuit, the low-pass filter configured to generate a filtered signal based on the charge pump signal; and
a voltage-controller oscillator coupled to the low-pass filter and the divider and configured to generate the imaging clock signal based on the filtered signal.

9. The clock signal generator of claim 8, wherein the low-pass filter is coupled to the modulation circuit and configured to increase the frequency of the imaging clock signal in the first half-cycle based on the modulation signal and decrease the frequency of the imaging clock signal in the second half-cycle based on the modulation signal.

10. The clock signal generator of claim 9, wherein the modulation circuit is further configured to increase a current of the modulation signal in the first half-cycle of the modulation signal for increasing the frequency of the imaging clock signal and decrease the current of the modulation signal in the second half-cycle of the modulation signal for decreasing the frequency of the imaging clock signal.

11. The clock signal generator of claim 10, wherein the modulation signal has a triangular-shaped waveform.

12. The clock signal generator of claim 7, wherein the clock signal generator is programmable to store a pixel value indicating the number of pixels in the horizontal line of the image and the modulation circuit is further configured to determine the pixel count based on the pixel value.

13. The clock signal generator of claim 7, further comprising an adjustment circuit coupled to the modulation circuit and configured to generate an adjustment signal for modifying the frequency range based on a frequency of the reference clock signal and a frequency of the imaging clock signal.

14. The clock signal generator of claim 7, wherein the modulation circuit is further configured to generate the modulation signal for reducing electromagnetic interference in the imaging clock signal.

15. A method comprising:
determining a pixel count indicating a number of pixels in a horizontal line of an image to be displayed;
generating an imaging clock signal for displaying the image;
generating a modulation signal for spreading a frequency of the imaging clock signal across a frequency range at a modulation rate based on the pixel count, wherein the modulation signal comprises a first half-cycle and a second half-cycle following the first half cycle;
increasing the frequency of the imaging clock signal in the first half-cycle based on the modulation signal; and
decreasing the frequency of the imaging clock signal in the second half-cycle based on the modulation signal.

16. The method of claim 15, wherein generating the imaging clock signal comprises generating the imaging clock signal based on a reference clock signal, the method further comprising adjusting the frequency range for spreading the frequency of the imaging clock signal based on a frequency of the reference clock signal and a frequency of the imaging clock signal.

17. The method of claim 15, wherein increasing the frequency of the imaging clock signal in the first half-cycle comprises increasing a current of the modulation signal in the first half-cycle of the modulation signal, and wherein decreasing the frequency of the imaging clock signal in the second half-cycle comprising decreasing the current of the modulation signal in the second half-cycle of the modulation signal.

18. The method of claim 15, wherein the modulation signal has a triangular-shaped waveform.

19. The method of claim 15, further comprising:
programming the clock signal generator to store a pixel value indicating the number of pixels in the horizontal line of the image; and
determining the pixel count based on the pixel value.

20. The method of claim 15, wherein generating the modulation signal is for reducing electromagnetic interference in the imaging clock signal.

* * * * *